United States Patent [19]
Ishimaru et al.

[11] Patent Number: 5,998,970
[45] Date of Patent: Dec. 7, 1999

[54] BATTERY CHARGING OPERATION AND A DETECTION OF A FULLY CHARGED CONDITION OF THE CHARGED BATTERY

[75] Inventors: Kenrou Ishimaru; Nobuhiro Takano, both of Hitachinaka, Japan

[73] Assignee: Hitachi Koki Co., Ltd., Tokyo, Japan

[21] Appl. No.: 09/106,306

[22] Filed: Jun. 29, 1998

[30] Foreign Application Priority Data

Jul. 4, 1997 [JP] Japan ................................ 9-179781

[51] Int. Cl.$^6$ .................................................. H02J 7/00
[52] U.S. Cl. ........................................ 320/132; 320/130
[58] Field of Search ................................. 320/132, 148, 320/153, 130

[56] References Cited

U.S. PATENT DOCUMENTS 4,998,057  3/1991  Shinohara et al. ..................... 320/150
5,185,565  2/1993  Uchida ................................. 320/163
5,621,302  4/1997  Shinohara ............................ 320/148

*Primary Examiner*—Peter S. Wong
*Assistant Examiner*—Lawrence Luk
*Attorney, Agent, or Firm*—Louis Woo

[57] ABSTRACT

A microcomputer performs a total of 100 sampling actions during a 1 sec sampling period for obtaining a plurality of battery voltage data V. In each sampling period, a minimum value υmin and a maximum value υmax are stored in a RAM 53. A peak value VMAX, used for detecting a peak battery voltage in the charging operation, is renewed by a largest data among the sampled minimum values υmin. A differenc ΔV between the peak value VMAX and the maximum value υmax is calculated the end of each sampling period. And, when the calculated difference ΔV exceeds a predetermined value, a judgement is made that the battery is fully charged.

8 Claims, 3 Drawing Sheets

BATTERY CHARGING OPERATION AND A DETECTION OF A FULLY CHARGED CONDITION OF THE CHARGED BATTERY

BACKGROUND OF THE INVENTION

The present invention relates to a battery charging apparatus and a battery charging method for charging rechargeable batteries including alkali electrolytic solution type secondary batteries, such as nickel-cadmium batteries and nickel-hydrogen batteries.

A conventionally known method for detecting a full-charge condition of a nickel-cadmium battery or the like is performed by sampling a battery voltage at predetermined intervals during a charging operation. The value of the sampled battery voltage increases in accordance with the progress of the charging operation. This maximum value (VMAX) is memorized after finishing every sampling. Then, a newly sample battery voltage (V) is compared with the memorized maximum value. When the difference ($\Delta V$= VMAX−V) is equal to or larger than a predetermined value ($\delta$), it is regarded that the battery voltage value showed a decline after reaching a peak. That is, when the battery is fully charged, the battery voltage (V) causes a predetermined voltage drop from the peak value (VMAX). Upon detecting this characteristic decline of the battery voltage ($\Delta V \geq \delta$), the charging operation is stopped. This conventional charging method is referred to as a "$-\Delta V$ charge control method" and, for example, disclosed in the U.S. Pat. No. 4,998,057.

Generally, this kind of monitoring operation for detecting the battery charging condition is realized by a microcomputer. The battery voltage is A/D converted when it is processed by the microcomputer.

However, when a sampled battery voltage value is near a threshold of an A/D converter, a converted digital value possibly fluctuates or hunts between two digital values due to a quantization error. For example, when a resolution is 256 bits/5 V full scale, an input voltage may have a value in the vicinity of 128.5/256*5 V. In this case, the converted digital value fluctuate between 128 and 129.

If the above-described predetermined value ($\delta$) is 1 bit, this will result in a failure in the judgement of the charging condition.

To avoid this malfunction, the predetermined value ($\delta$) must have a larger margin equal to or larger than 2. However, setting a large margin in the charging operation is not preferably in that the sensitivity in the detection of the fully-charged condition is worsened. Needless to say, the lowered sensitivity results in an excessive charging. The cycle life of the battery will be shortened undesirably.

SUMMARY OF THE INVENTION

An object of the present invention is to provide a battery charging method and a related apparatus for accurately detecting the fully-charged condition of the battery.

In order to accomplish this and other related objects, a first aspect of the present invention provides a battery charging method comprising the following steps. A plurality of sampling actions are performed during a predetermined sampling period for obtaining a plurality of battery voltage data when a battery is charged. Among the sampled battery voltage data, a minimum value and a maximum value are stored in each sampling period. A peak value, used for detecting a peak voltage during the charging operation, is renewed by a largest data among the sampled minimum values. A difference between the peak value and the maximum value is obtained at the end of each sampling period. When the obtained difference exceeds a predetermined value, a judgement is made that the battery is fully charged.

A second aspect of the present invention provides a battery charging apparatus comprising a charging means for charging a battery. A sampling means is provided for performing a plurality of sampling actions during a predetermined sampling period for obtaining a plurality of battery voltage data. A memory means is provided for storing a minimum value and a maximum value among the sampled battery voltage data in each sampling period. A peak detecting means is provided for detecting a peak of the battery voltage. A peak value, used for detecting the peak voltage during the charging operation, is renewed by a largest data among the sampled minimum values. A decline detecting means is provided for obtaining a difference between the peak value and the maximum value at the end of each sampling period. And, a full-charge condition detecting means is provided for making a judgement that the battery is fully charged when the obtained difference exceeds a predetermined value.

According to the present invention, it is preferable that the battery voltage data are in a digital form processible in a microcomputer. The predetermined value used in the judgement of the full-charge condition is a predetermined bit number. And, the sampling period is repetitively restarted until the full-charge condition is detected.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENT

A preferred embodiment of the present invention will be explained with reference to FIGS. 1 through 4.

Figure 1:
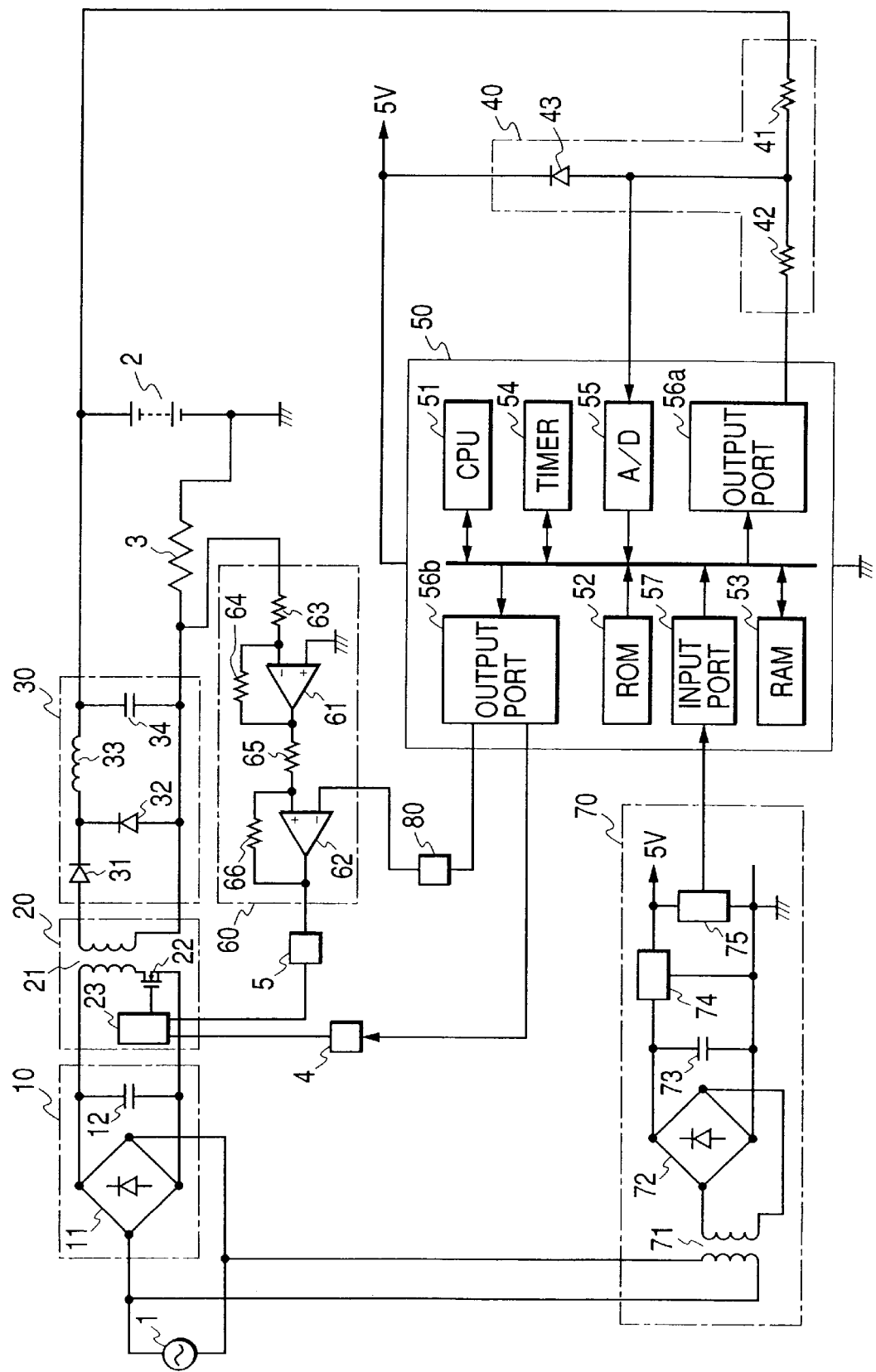
FIG. 1 is a circuit diagram showing a preferable embodiment of a battery charging apparatus in accordance with the present invention.

FIG. 1 shows a preferable embodiment of a battery charging apparatus in accordance with the present invention. An AC (alternating current) power source 1 supplies electric power to charge a battery assembly 2. The AC power source 1 is connected to the battery assembly 2 via a primary rectifying/smoothing circuit 10, a switching circuit 20 and a secondary rectifying/smoothing circuit 30.

The battery assembly 2 comprises a plurality of rechargeable batteries which are connected in series. A resistor 3, connected to the battery assembly 2, serves as a current detecting means for detecting a charge current flowing across the battery assembly 2. A control signal transmitting unit 4, such as a photo coupler, transmits a control signal for starting or stopping the charging of the battery. A feedback signal transmitting unit 5, such as a photo coupler, transmits a charge current signal to a PWM (pulse width modulation) control IC 23.

The primary rectifying/smoothing circuit 10 comprises a full-wave rectifier 11 and a smoothing capacitor 12. The switching circuit 20 comprises a high-frequency transformer 21, a MOSFET (metal oxide silicon field effect transistor) 22 and the PWM control IC 23.

The PWM control IC 23 serves as a switching power source IC that is capable of adjusting an output voltage of the primary rectifying/smoothing circuit 10 by changing a drive pulse width of the MOSFET 22.

The secondary rectifying/smoothing circuit 30 comprises two diodes 31, 32, a choke coil 33, and a smoothing capacitor 34.

A battery voltage detecting circuit 40, associated with a microcomputer 50, detects a voltage of the battery assembly 2. The battery voltage detecting circuit 40 comprises two resistors 41, 42 and an input protecting diode 43. The microcomputer 50 comprises a CPU 51, a ROM 52, a RAM 53, a timer 54, an A/D converter 55, output ports 56a, 56b and a reset input port 57.

A charge current control circuit 60 is interposed in a feedback path between the resistor 3 and the switching circuit 20. The charge current control circuit 60 comprises two operational amplifiers 61 and 62 and four resistors 63~66.

A constant-voltage source 70, serving as a power source for the microcomputer 50 and the charge current control circuit 60, is connected with the AC power source 1. The constant-voltage source 70 comprises a power transformer 71, a full-wave rectifier 72, a smoothing capacitor 73, a three-terminal regulator 74, and a reset IC 75. The reset IC 75 generates a reset signal entered into the reset input port 57 of the microcomputer 50. The microcomputer 50 is initialized in response to this reset signal.

A charge current setting unit 80 is interposed between the microcomputer 50 and the charge current control circuit 60. The charge current setting unit 80 sets a voltage value applied to a non-inversion input terminal of the operational amplifier 62 in response to a signal supplied from the output port 56b.

Figure 2:
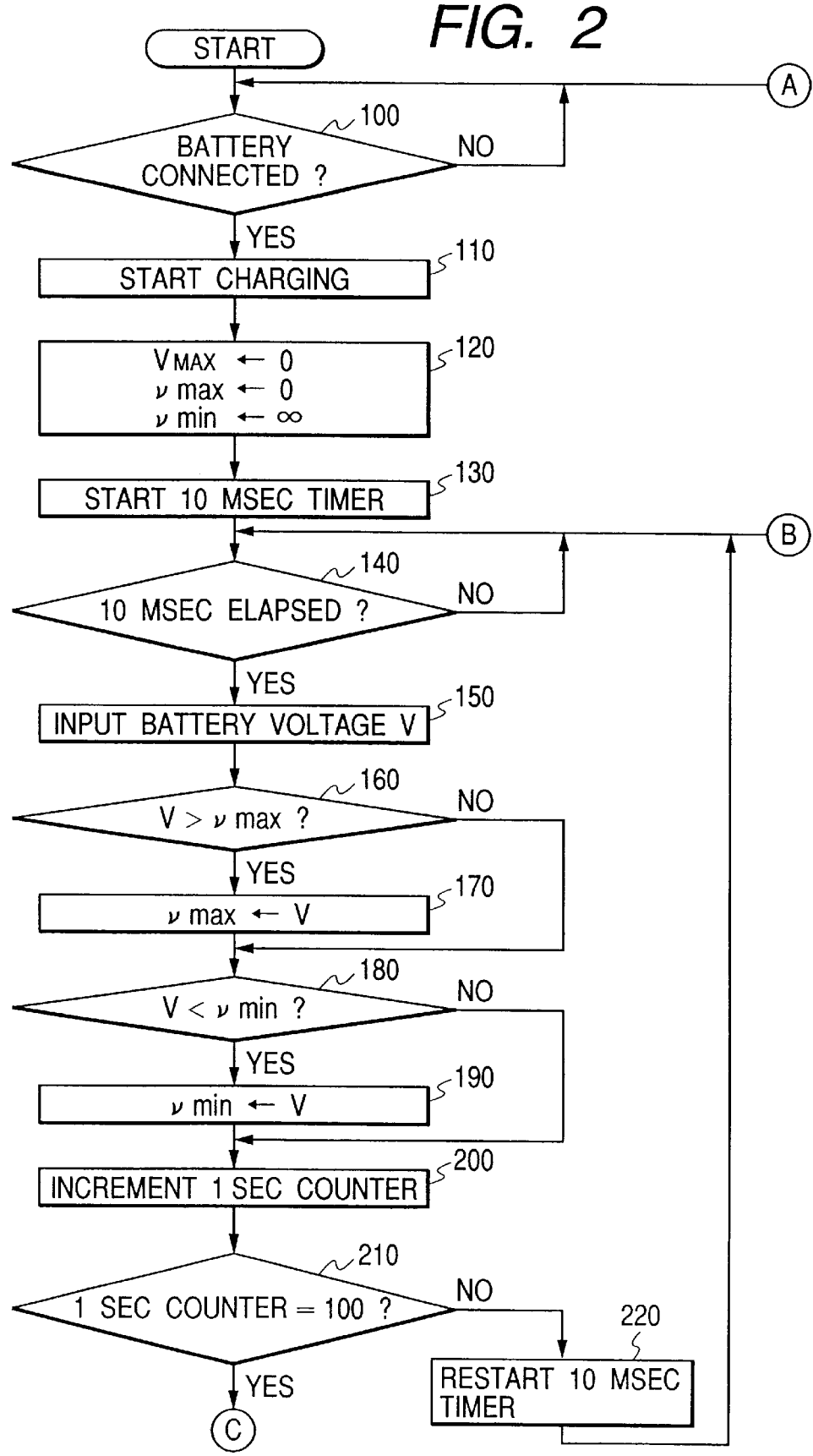
FIG. 2 is a flowchart showing part of a battery charging operation performed by the battery charging apparatus in accordance with the present invention.
Figure 3:
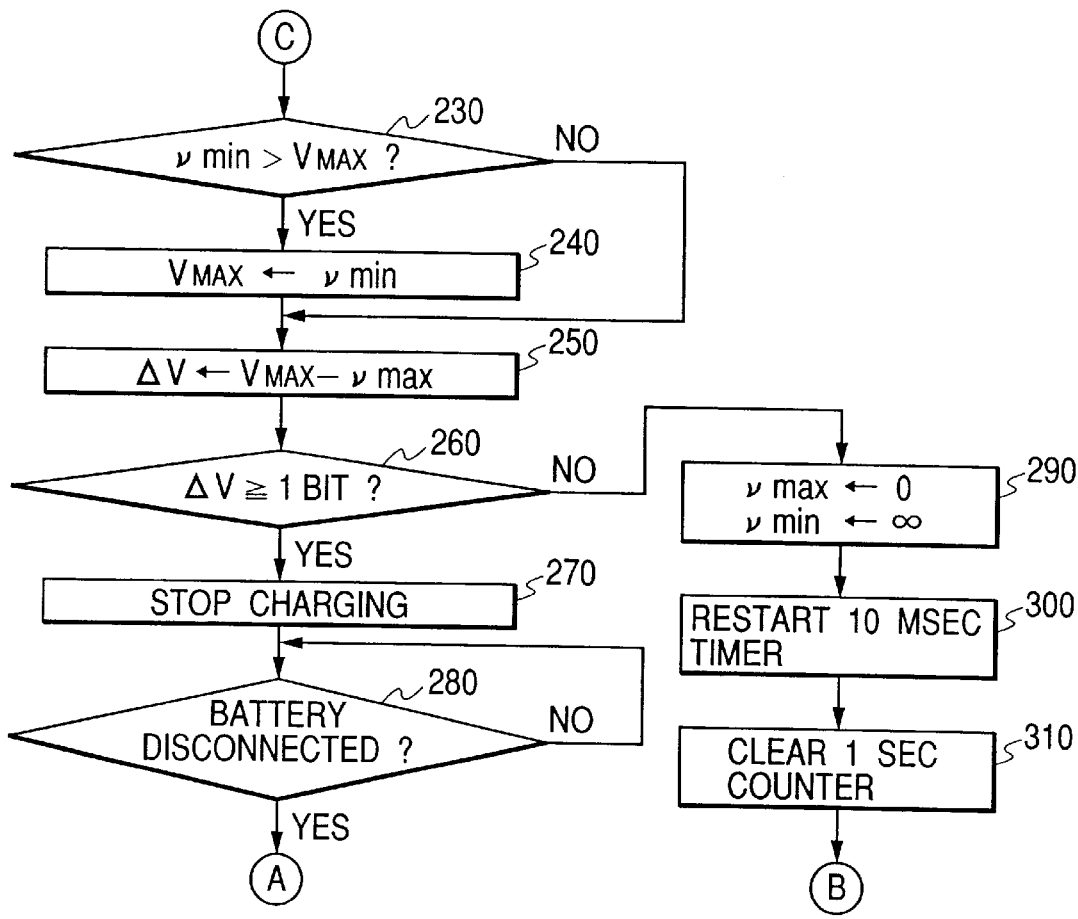
FIG. 3 is a flowchart showing remainder of the battery charging operation performed by the battery charging apparatus in accordance with the present invention.

A charging operation performed by the charging apparatus shown in FIG. 1 will be explained in detail with reference to the flowcharts shown in FIGS. 2 and 3. The flowcharts shown in FIGS. 2 and 3 are stored in the ROM 52 and executed by the CPU 51 in the microcomputer 50.

When the AC power source 1 is turned on (i.e., start of the flowchart), the microcomputer 50 checks in a step 100 whether or not the battery assembly 2 is connected. More specifically, the microcomputer 50 judges the connecting condition of the battery assembly 2 based on an output signal of the battery voltage detecting circuit 40. When no connection of the battery assembly 2 is detected (NO in the step 100), the microprocessor 50 repeats the step 100 until the judgement turns to YES.

When the battery assembly 2 is connected (YES in step 100), the microprocessor 50 proceeds to a step 110 to start a charging operation. The microcomputer 50 generates a charge start signal from the output port 56b and transmits it to the PWM control IC 23 via the control signal transmitting unit 4.

The resistor 3 measures a charge current flowing across the battery assembly 2 during the charging operation. A voltage corresponding to the measured charge current is compared with a preset voltage (corresponding to a charge current reference value) in the charge current control circuit 60. An output of the charge current control circuit 60, representing a difference between the compared voltages, is fed back to the PWM control IC 23 via the feedback signal transmitting unit 5. When the charge current is larger than the reference value, the PWM control IC 23 reduces the pulse width. When the charge current is smaller than the reference value, the PWM control IC 23 increases the pulse width. The modulated pulse width is supplied to the high-frequency transformer 21. The output of the high-frequency transformer 21 is converted by the secondary rectifying/smoothing circuit 30 into a smoothed direct current. Thus, the charge current is maintained at a constant value. As apparent from the foregoing description, the resistor 3, the charge current control circuit 60, the feedback signal transmitting unit 5, the switching circuit 20 and the secondary rectifying/smoothing circuit 30 cooperatively control the charge current.

After starting the charging operation, the microcomputer 50 initializes a peak value VMAX, a maximum value $\upsilon$max and a minimum value $\upsilon$min that are stored in the RAM 53. The RAM 53 serves as a battery voltage memory means for storing the battery voltages temporarily measured during the charging operation. Initial values of the peak value VMAX, the maximum value $\upsilon$max and the minimum value $\upsilon$min are 0,0 and $\infty$(i.e., VMAX ←0, $\upsilon$max ←0, and $\upsilon$min←$\infty$), respectively, as shown in step 120.

Next, the microcomputer 50 proceeds to a step 130 to start a 10 msec timer set by the timer 54. Then, in a step 140, it is checked whether or not a predetermined time (i.e., 10 msec) has elapsed. When the predetermined time has not elapsed (i.e., NO in step 140), the microcomputer repeats the step 140 until the judgement turns to YES.

When the predetermined time has elapsed (YES in step 140), the microcomputer 50 inputs an output signal of the battery voltage detecting circuit 40. The battery voltage detecting circuit 40 divides the battery voltage by using the resistors 41 and 42 connected between the battery assembly 2 and the output port 56a of the microcomputer 50. The input protecting diode 43 prevents the divided-voltage signal from exceeding a predetermined allowable value. The output of the battery voltage detecting circuit 40 (i.e., the divided-voltage signal) is entered into the A/D converter 55 of the microcomputer 50. The A/D converter 55 converts the entered divided-voltage signal into a digital form. Thus, in a step 150, the microcomputer 50 inputs a battery voltage V which is a digital signal converted by the A/D converter 55.

Then, the microcomputer 50 proceeds to a step 160 to compare the battery voltage V detected in the present sampling operation with the $\upsilon$max stored in the RAM 53. When the sampled battery voltage V is larger than the $\upsilon$max (i.e., YES in step 160), the microcomputer 50 proceeds to a step 170 to renew the $\upsilon$max by the sampled battery voltage V and then proceeds to a step 180. When the sampled battery voltage V is equal to or smaller than the $\upsilon$max (i.e., NO in step 160), the microcomputer 50 skips the step 170 and proceeds to the step 180 to further compare the sampled battery voltage V with the $\upsilon$min stored in the RAM 53. When the sampled battery voltage V is smaller than the $\upsilon$min (i.e., YES in step 180), the microcomputer 50 proceeds to a step 190 to renew the $\upsilon$min by the sampled battery voltage V and then proceeds to a step 200. When the sampled battery voltage V is equal to or larger than the $\upsilon$min (i.e., NO in step 180), the microcomputer 50 skips the step 190 and proceeds to the step 200 to increment a 1 sec counter.

Subsequently, the microcomputer 50 proceeds to a step 210 to check whether or not the 1 sec counter is equal to 100.

When the 1 sec counter reaches 100, it means that 1 sec (10 msec×100=1 sec) has elapsed. When the 1 sec counter is smaller than 100 (i.e., NO in step 210), the microcomputer 50 proceeds to a step 220 to restart the 10 msec timer and then returns to the step 140 to repeat the processing of the steps 140 to 210.

When the 1 sec counter is equal to 100 (i.e., YES in step 210), the microcomputer 50 proceeds to a step 230.

At this moment, the RAM 53 stores the υmax and the υmin as the maximum and minimum data sampled during the latest sampling period of one second (=100 latest sampling actions).

In the step 230, the microcomputer 50 compares the υmin with the VMAX stored in the RAM 53. When the υmin is larger than the VMAX (i.e., YES in step 230), the microcomputer 50 proceeds to a step 240 to renew the VMAX by the υmin and then proceeds to a step 250. When the υmin is equal to or smaller than the VMAX (i.e., NO in step 230), the microcomputer 50 skips the step 240 and proceeds to the step 250 to calculate ΔV=VMAX−υmax.

Then, the microcomputer 50 proceeds to a step 260 to compare the calculated ΔV with 1 bit. When ΔV is smaller than 1 bit (i.e., NO in step 260), the microcomputer 50 proceeds to a step 290 to reset the υmax and the υmin (i.e., υmax ←0, υmin ←∞). Then, the microprocessor 50 proceeds to a step 300 to restart the 10 msec timer, and further proceeds to a step 310 to clear the 1 sec counter. Thereafter, the microcomputer 50 returns to the step 140 to repeat the processing of steps 140 to 250.

When ΔV is equal to or larger than 1 bit (i.e., YES in step 260), the microcomputer 50 proceeds to a step 270 to stop the charging operation. The microprocessor 50 generates a charge stop signal from the output port 56b and transmits it to the PWM control IC 23 via the control signal transmitting unit 4. Thus, in the step 270, the microcomputer 50 stops the charging operation.

Then, the microcomputer 50 proceeds to a step 280 to check whether or not the battery assembly 2 is disconnected. When the battery assembly 2 is disconnected (i.e., YES in step 280), the microcomputer 50 returns to the step 100 to wait the charging operation of the next battery assembly 2.

As explained in the foregoing description, the present invention performs a plurality of sampling actions (100 sampling actions according to the abovedescribed embodiment) during a predetermined sampling period (1 sec according to the above-described embodiment). During one sampling period, the maximum value and the minimum value of the battery voltage are memorized as the υmax and the υmin, respectively. After the elapse of each sampling period, the minimum value υmin is compared with the peak value VMAX. In accordance with the progress of the charging operation, the battery voltage increases continuously. Thus, the peak value VMAX is successively renewed by the latest minimum value υmin.

Figure 4:
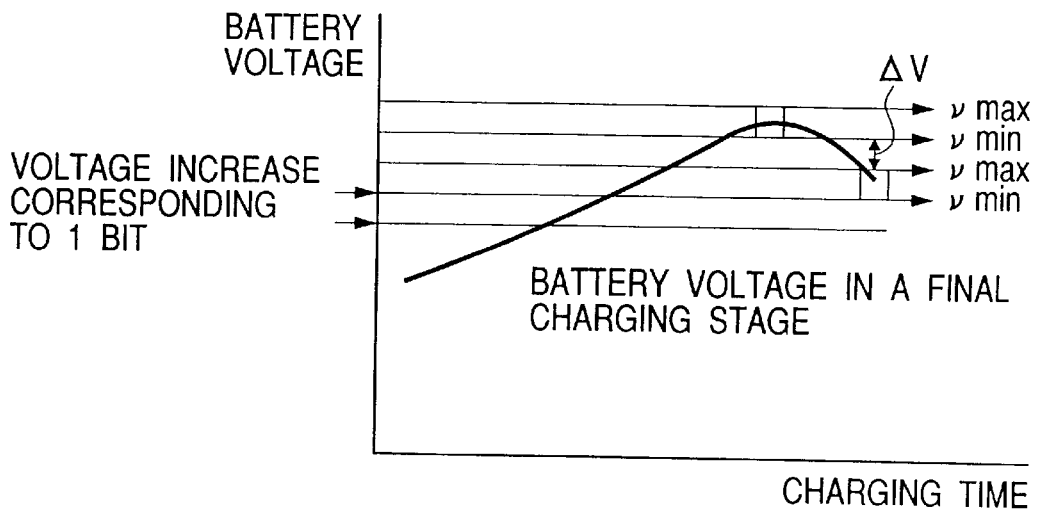
FIG. 4 is a graph showing a charging characteristic of the battery.

However, at the final stage of the charging operation, the battery voltage shows a decline after passing a peak as shown in FIG. 4. The present invention accurately detects this decline as a sign of the fully charged condition. More specifically, when the difference ΔV(=VMAX−υmax) is equal to or larger than a predetermined value (1 bit according to the above-described embodiment), it is concluded that the battery assembly 2 is fully charged. According to the charging operation of the above-described embodiment, it becomes possible to surely prevent the battery from being excessively charged. The cycle life of the battery can be extended.

The sample period and the total number of the sampling actions performed in each sampling period should be determined by considering the influences of the charge current and the battery temperature. Accordingly, the preferable sample period and the preferable sampling action number are not limited to the disclosed values (1 sec, 100 sampling actions) adopted in the above-described embodiment.

This invention may be embodied in several forms without departing from the spirit of essential characteristics thereof. The present embodiment as described is therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A battery charging method comprising the steps of:
    performing a plurality of sampling actions for obtaining a plurality of battery voltage data during a predetermined sampling period when a battery is charged;
    storing a minimum value and a maximum value among said battery voltage data in each sampling period;
    renewing a peak value by a largest data among the sampled minimum values;
    obtaining a difference between said peak value and said maximum value at the end of each sampling period; and
    making a judgement that the battery is fully charged when said obtained difference exceeds a predetermined value.

2. The battery charging method in accordance with claim 1, wherein said battery voltage data are in a digital form processible in a microcomputer.

3. The battery charging method in accordance with claim 2, wherein said predetermined value used in the judgement of the full-charge condition is a predetermined bit number.

4. The battery charging method in accordance with claim 1, further comprising a step of repetitively restarting said sampling period until the full-charge condition is detected.

5. A battery charging apparatus comprising:
    charging means for charging a battery;
    sampling means for performing a plurality of sampling actions for obtaining a plurality of battery voltage data during a predetermined sampling period when the battery is charged;
    memory means for storing a minimum value and a maximum value among said battery voltage data in each sampling period;
    peak detecting means for renewing a peak value by a largest data among the sampled minimum values;
    decline detecting means for obtaining a difference between said peak value and said maximum value at the end of each sampling period; and
    full-charge condition detecting means for making a judgement that the battery is fully charged when said obtained difference exceeds a predetermined value.

6. The battery charging apparatus in accordance with claim 5, wherein said battery voltage data obtained by said sampling means are in a digital form processible in a microcomputer.

7. The battery charging apparatus in accordance with claim 6, wherein said predetermined value used in said full-charge condition detecting means is a predetermined bit number.

8. The battery charging apparatus in accordance with claim 5, wherein said sampling means repetitively restarts said sampling period until the full-charge condition is detected.

* * * * *